United States Patent
Palm et al.

(10) Patent No.: US 6,812,559 B2
(45) Date of Patent: Nov. 2, 2004

(54) POWER MODULE WITH IMPROVED TRANSIENT THERMAL IMPEDANCE

(75) Inventors: Gerhard Palm, Sickte (DE); Yehia Tadros, Stuttgart (DE); Markus Thoben, Offenbach (DE)

(73) Assignee: DaimlerChrysler AG, Stuttgart (DE)

( * ) Notice: Subject to any disclaimer, the term of this patent is extended or adjusted under 35 U.S.C. 154(b) by 23 days.

(21) Appl. No.: 10/450,202

(22) PCT Filed: Dec. 1, 2001

(86) PCT No.: PCT/EP01/14058
§ 371 (c)(1), (2), (4) Date: Nov. 7, 2003

(87) PCT Pub. No.: WO02/49104
PCT Pub. Date: Jun. 20, 2002

(65) Prior Publication Data
US 2004/0056346 A1 Mar. 25, 2004

(30) Foreign Application Priority Data
Dec. 13, 2000 (DE) ........................ 100 62 108

(51) Int. Cl.⁷ ............................................. H01L 23/52
(52) U.S. Cl. ..................................... 257/691; 257/707
(58) Field of Search ................................ 257/706, 707, 257/714, 691, 705, 762, 764; 267/712

(56) References Cited

U.S. PATENT DOCUMENTS

| | | | |
|---|---|---|---|
| 4,556,899 A | * 12/1985 | Kurihara et al. | 257/747 |
| 4,727,455 A | * 2/1988 | Neidig et al. | 361/700 |
| 5,529,852 A | * 6/1996 | Sasame et al. | 428/620 |
| 5,654,586 A | 8/1997 | Schwarzbauer | |
| 5,786,230 A | 7/1998 | Anderson et al. | |
| 5,869,890 A | * 2/1999 | Nishiura et al. | 257/705 |
| 5,966,291 A | 10/1999 | Bäumel et al. | |
| 5,998,043 A | * 12/1999 | Sasaki et al. | 428/627 |
| 6,122,170 A | * 9/2000 | Hirose et al. | 361/704 |
| 6,529,380 B1 | * 3/2003 | Kono | 361/708 |

FOREIGN PATENT DOCUMENTS

| | | |
|---|---|---|
| DE | 34 14 065 | 12/1985 |
| DE | 196 47 590 | 5/1998 |
| DE | 197 00 963 | 7/1998 |
| EP | 0 242 626 | 10/1987 |
| EP | 0 376 478 | 7/1990 |
| EP | 0 862 209 | 9/1998 |
| EP | 0 901 166 | 3/1999 |
| FR | 2 786 657 | 6/2000 |
| JP | 59-009953 | 1/1984 |
| WO | WO 99/19906 | 4/1999 |

* cited by examiner

Primary Examiner—S. V. Clark
(74) Attorney, Agent, or Firm—Crowell & Moring LLP

(57) ABSTRACT

An electronic power module includes at least one electronic power device, a DCB ceramic substrate, a heat sink and at least one additional thermal capacitance. The electronic power devices are connected by a sintered layer on their underside to an upper copper layer of the DCB ceramic substrate. The upper copper layer of the DCB ceramic substrate is structured into copper conductor tracks for electrically contacting the power devices. The lower copper layer of the DCB ceramic substrate is connected by a sintered layer to a heat sink. The upper sides of the power devices are connected by a sintered layer to an addition thermal capacitance.

20 Claims, 2 Drawing Sheets

POWER MODULE WITH IMPROVED TRANSIENT THERMAL IMPEDANCE

BACKGROUND AND SUMMARY OF THE INVENTION

The invention relates to a construction comprising an electronic power device, such as for example a high-power converter, an IGBT, a power-MOSFET, power diodes or combinations of power devices on a DCB ceramic. The DCB ceramic of the power device is cooled directly by a heat sink, in order to remove the dissipated power of the power device.

To reduce the thermal resistance between the power device and the electrical contact layer, it has been proposed in EP 0 242 626 B1 to provide a paste on the underside of the power devices. The paste contains a metal powder, preferably a silver powder, in a solvent. These pretreated power devices are connected with the aid of a pressure-sintering process to a contact layer of a flat form. The contacts of a flat form and the use of highly heat-conductive silver for contacting allowed the thermal transition between the power device and the contacting layer to be improved.

Further improvements in the cooling of power devices succeeded in the past with so-called DCB ceramics (DCB= Direct Copper Bonding). In DE 197 00 963 A1, it is proposed for this purpose on a ceramic substrate laminated on both sides with copper to solder the power devices onto the upper side of the DCB ceramic and to solder the underside of the DCB ceramic onto a metal plate acting as a leadframe. This metal plate passes the dissipated heat on to a connected cooling system. The upper copper layer of the DCB ceramic is structured (interrupted), whereby conductor tracks for contacting the power devices on their underside are formed. The further contacting of the power devices takes place on their upper side with bonding wires.

If it were desired to combine the benefits of the two processes described above, on the one hand the pressure-sintering of power devices onto a contacting layer and, on the other hand, the soldering of a DCB ceramic onto a metal plate for the further connection of the metal plate to a cooling system, at least two different process technologies would have to be used for the construction of a power device, that is pressure-sintering and soldering. To produce the connection to a cooling system, a further process technology is generally also necessary, since the metallic base plate of the power device is connected to the cooling system in a conventional way by a heat conducting paste. However, the use of a number of different process technologies in the constructing and connecting technique of power devices makes the process for producing the power devices complex and expensive.

On the basis of the prior art described above, the object according to the invention is to provide a power module with improved thermal behavior which is largely insensitive to thermal load changes.

According to the invention, this object is achieved by a power module of a construction which is connected merely by the pressure-sintering process. For additional improvement of the transient thermal behavior, the power devices are fitted with additional thermal capacitances.

An electronic power module according to the invention comprises at least one electronic power device, a DCB ceramic substrate, a heat sink and at least one additional thermal capacitance, the electronic power devices being connected by a sintered layer on their underside to the upper copper layer of the DCB ceramic substrate, the upper copper layer of the DCB ceramic substrate being structured into copper conductor tracks for the electrical contacting of the power devices, the lower copper layer of the DCB ceramic substrate being connected by a sintered layer to a heat sink, and the upper sides of the power devices being connected by a sintered layer to an additional thermal capacitance.

Further advantageous embodiments of a power module according to the invention are contained in the subclaims.

The following advantages are primarily achieved by the invention.

By dispensing with a metallic base plate, which is used in the conventional module construction of power modules, to mount the module onto a heat sink, the heat removal of the dissipated heat from the power devices into the heat sink is improved. The direct connection of the DCB ceramic to a heat sink improves the steady-state thermal resistance of the power module according to the invention in comparison with conventional constructions by up to 50%.

The reduced volume of the construction brought about by dispensing with a conventional base plate also has the effect of reducing the thermal capacitance of the construction, which is of significance for the transient thermal behavior. In order to utilize the improved heat transfers of the power module according to the invention optimally even under transient thermal loads, the power module contains additional heat capacitances on the surface of the power devices. As a result, briefly occurring peak values of the thermal dissipated power are buffered in the heat capacitances and, as a result, the transient thermal behavior of the power module is improved. By virtue of the heat capacitances arranged directly on the power devices, the transient thermal resistance of the power module is reduced by 25–30%, preferably halved.

The exclusive use of the pressure-sintering process as a connecting technique for the construction of the power module decisively increases its load changing resistance with respect to thermal load changes in comparison with a power module constructed by a conventional soldering technique. Under thermal load changes in the temperature range from minus 55° C. to 125° C., an increase in the load changing resistance by at least a factor of 12 can be achieved with a power module constructed by the pressure-sintering connection technique in comparison with a power module constructed by soldered connection.

By contrast with soft soldering processes, the sintered connection is produced as a consequence of a solid-state reaction. This has the consequence that the pressure-sintered connection, which is produced at a process temperature in the range of 215° C. to 250° C., can be used under the same or even much higher operating temperatures. On the one hand, subsequent mounting of components at the same process temperature is therefore possible, so that problems such as soldering with solders of different melting temperature no longer arise. On the other hand, the pressure-sintering technique can also be used for the construction of future generations of power devices on an SiC basis (silicon carbide basis), without modifications in the process technology being necessary for this.

A further advantage lies in the quality of a pressure-sintered connection. In particular, in cases of large surface areas, there are often voids (air inclusions) in soldered connections. The voids sometimes account for up to 50% of the soldered connection and consequently cause a rise in the thermal resistance. The pressure-sintered connection, on the other hand, can be produced with a small layer thickness of less than 30 micrometers in void-free quality even for large surface areas.

BRIEF DESCRIPTION OF THE DRAWINGS

Exemplary embodiments of the invention are presented and explained in more detail below on the basis of drawings, in which.

DETAILED DESCRIPTION OF THE DRAWINGS

Figure 1:
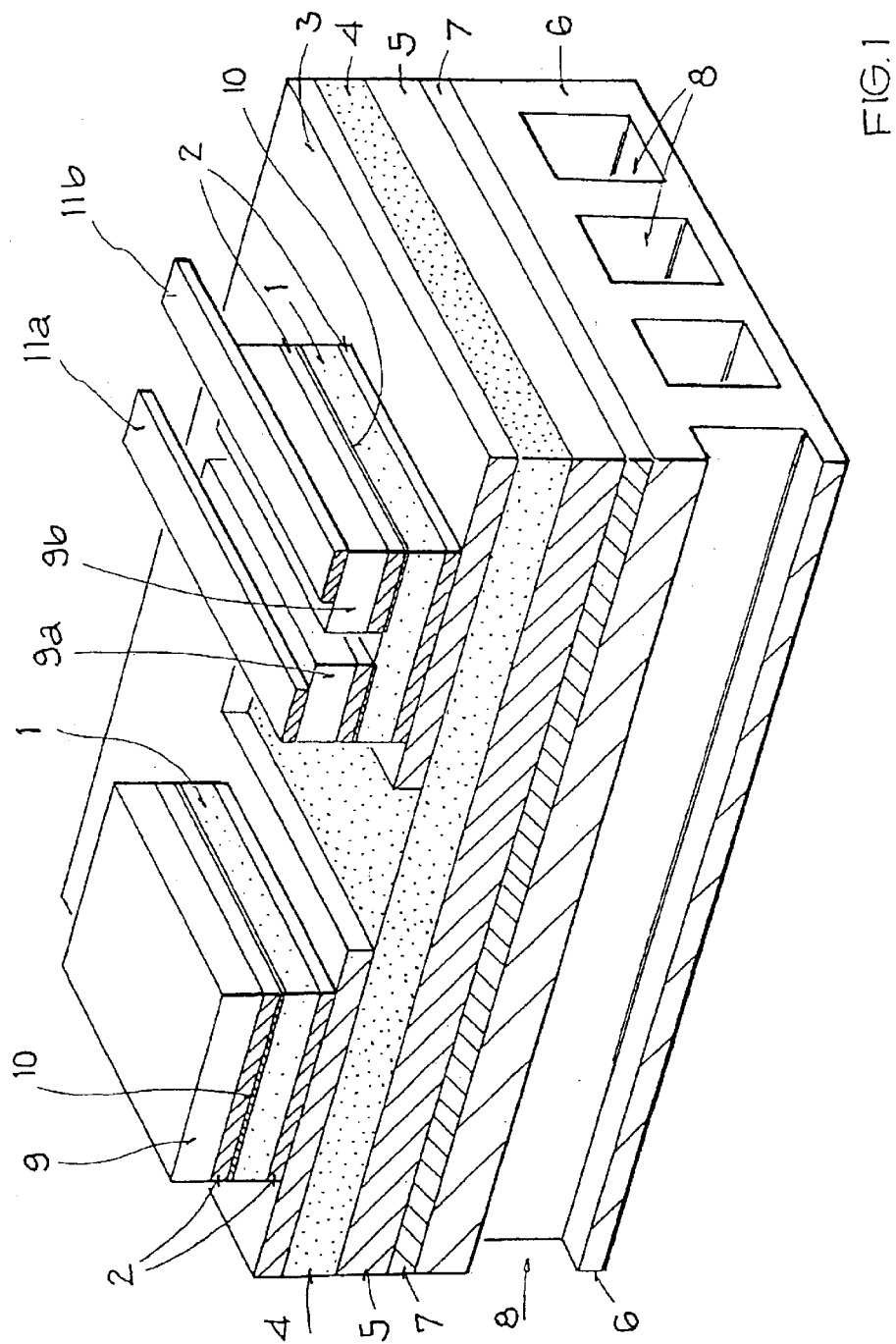
FIG. 1 shows a schematic construction of a water-cooled power module according to the invention with thermal capacitances of molybdenum mounted on the upper side.

In FIG. 1, two electronic power devices 1, preferably semiconductor power devices, have been applied with a pressure-sintered layer 2 on a copper layer 3. The copper layer 3 serves for the electrical contacting of the power devices on their underside. For this purpose, the copper layer may be structured or interrupted to form a number of separate conductor tracks. As a result, it is even possible for a number of power devices to be contacted independently of one another. The copper layer 3 is a component part of a so-called DCB ceramic (Direct Copper Bonding ceramic). The DCB ceramic comprises an upper copper layer 3, a ceramic layer 4 and a lower copper layer 5. The ceramic layer 4 is, for example, formed from aluminum oxide, preferably from $Al_2O_3$. The lower copper layer serves for the further connection of the construction to a copper heat sink 6. This connection is also produced by a further pressure-sintered layer 7. The copper heat sink is preferably formed with cooling channels 8, so that even high amounts of dissipated power can be removed with a cooling medium which flows in the cooling channels. The copper heat sink 6 primarily undertakes the steady-state cooling of the power devices 1. For briefly occurring transient heat loads of the power devices, additional thermal capacitances 9, 9a, 9b are attached to the upper side of the power devices. These thermal capacitances are also attached by a pressure-sintered layer 10 on the power devices 1. In a preferred embodiment, the thermal capacitances 9 are produced from molybdenum.

The pressure-sintered connection layers 2, 7, 10 are produced by a silver powder suspended in a solvent being applied to at least one of the surface areas respectively to be connected. Subsequently, the suspending agent is vaporized at a temperature of 150° C. to 250° C. The surface areas to be connected are placed one on top of the other and the silver layer is sintered at 215° C. to 250° C. and 40 Mpa over a period of 1 to 2 minutes in a press. In the press, the pressure is coupled to the devices via a silicone rubber in order to achieve hydrostatic conditions.

The surface areas to be connected must be oxide-free for the pressure-sintering process to be used. It is therefore recommendable before connecting the surface areas to treat them appropriately to remove oxide films which may be present. Another possibility is to metallize the components to be connected to one another respectively with a layer of precious metal, such as silver or gold. Gold plating reliably prevents oxide films from forming on the surfaces of the individual components even over a lengthy storage time. In a particularly preferred configuration of a power module, the power devices 1, the DCB ceramic 3, 4, 5, the copper heat sink 6 and the thermal capacitances 9, 9a, 9b, 12 are therefore respectively gold-plated.

For further contacting of the power devices, electrical contacts 11a, 11b may be attached to their upper side, onto the thermal capacitances 9, 9a, 9b. If a number of contacts are to be attached to the upper side, it is recommendable also to attach a number of separate thermal capacitances to the upper side, since otherwise the different contacts 11a, 11b would be short-circuited by a single thermal capacitance made of molybdenum. The additional contacts on the upper side of the power module can be configured by conventional bonding wire technology. Melting of the pressure-sintered layers in the power module construction is not to be feared here, as explained at the beginning. Whenever possible, however, the pressure-sintering technique is also recommendable for the contacts 11a, 11b. In FIG. 1, the additional upper electrical contacts 11a, 11b are therefore formed as copper lugs which are likewise connected to the power module by the pressure-sintering process. We have dispensed with a representation of the conventional bonding wire contacting arrangements. Surface-area pressure-sintered connections of the copper lugs to the molybdenum thermal capacitances additionally promote the heat dissipation from the thermal capacitances into the copper lugs.

Figure 2:
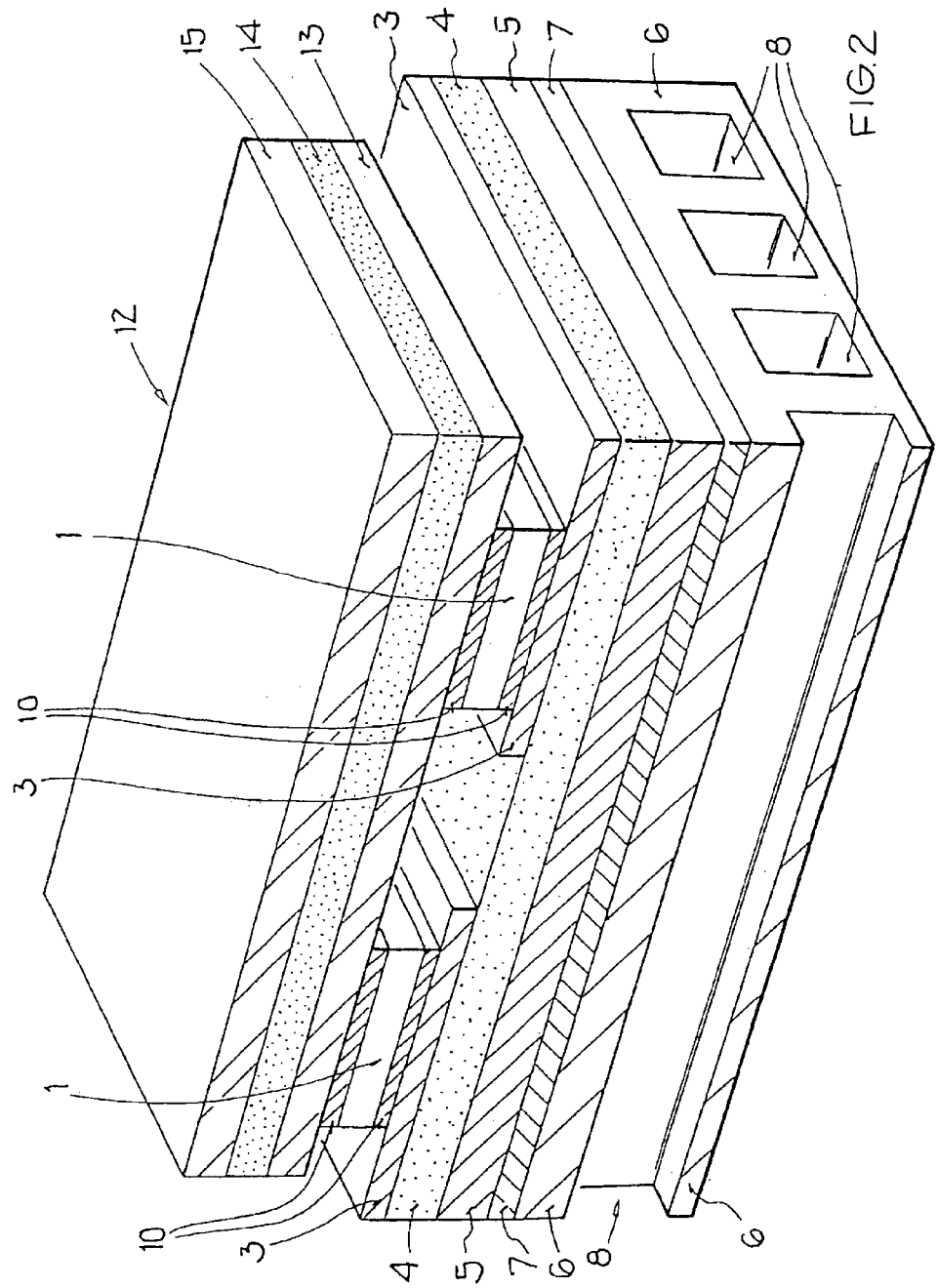
FIG. 2 shows a schematic construction of a water-cooled power module according to the invention with DCB ceramic mounted on the upper side.

In the exemplary embodiment of FIG. 2, the three separate molybdenum thermal capacitances from FIG. 1 are replaced by a unitary thermal capacitance 12 in the form of a DCB ceramic. This DCB ceramic is also formed by a lower copper layer 13, a ceramic layer 14 and an upper copper layer 15. In this exemplary embodiment, too, the unitary thermal capacitance 12 is attached to the upper side of the electronic power devices 1 by pressure-sintered layers 10. For the contacting of the power devices 1 on their upper side, the lower copper layer 13 of the DCB ceramic may be structured and interrupted, so that conductor tracks are formed in the copper layer for the separate contacting of the power devices. The forming of a unitary thermal capacitance has advantages in the construction of the power module, since only one component has to be connected to the upper side of the power devices. Use of the DCB ceramic mounted on the upper side for the electrical switching of the power devices also provides low-inductive contacting of the power devices, so that switching losses are avoided and the switching times of the power devices are shortened. The DCB ceramics are preferably formed by aluminum-silicon-carbide (AlSiC) ceramics.

Laboratory trials have shown that layer thicknesses of 2 millimeters to 3 millimeters are particularly advantageous for the molybdenum thermal capacitances from the exemplary embodiment of FIG. 1. With molybdenum thermal capacitances of a thickness of 2 millimeters, both the transient thermal resistance and the steady-state thermal resistance of a power module according to the invention can be halved in comparison with a power module conventionally constructed by the soldering connection technique and without additional thermal capacitances. The transient thermal resistance is in this case defined as the ratio of the maximum temperature swing of the power device under transient thermal loading to the steady-state dissipated power averaged over time. The halving of the thermal resistances allows doubling of the dissipated power density with which the power module according to the invention can be operated in comparison with a conventional power module.

The thermal resistances are also significantly improved by the thermal capacitance of DCB ceramic arranged on the upper side, in a way corresponding to the exemplary embodiment of FIG. 2. In order to achieve a halving of the thermal resistances for a thermal capacitance of DCB ceramic, however, a molybdenum layer 0.8 millimeters thick must be provided between the DCB ceramic arranged on the upper side and the power devices.

A power module constructed by the pressure-sintering process is particularly suitable for use in high ambient temperatures and under ambient conditions in which many thermal load changes take place. An ambience with high temperatures for semiconductor devices and with frequent thermal load changes is to be found, for example, in the direct vicinity of an internal combustion engine, for example in the engine compartment of a motor vehicle. In this application, the power devices are advantageously SiC power devices. Semiconductor devices based on silicon carbide have the necessary thermal stability for high-temperature applications up to about 250° C.

What is claimed is:

1. An electronic power module, comprising:
   at least one electronic power device;
   a DCB ceramic substrate;
   a heat sink; and
   at least one additional thermal capacitance, wherein
   a) the at least one electronic power device being connected by a sintered layer on an underside to an upper copper layer of the DCB ceramic substrate,
   b) the upper copper layer of the DCB ceramic substrate being structured into copper conductor tracks for electrically contacting the at least one power device,
   c) a lower copper layer of the DCB ceramic substrate being connected by a sintered layer to the heat sink, and
   d) an upper side of the at least one power device being connected by a sintered layer to the at least one additional thermal capacitance.

2. The power module as claimed in claim 1, in which the sintered layers are produced under temperatures in a range from 210° C. to 250° C. and a pressure of 40 megapascals.

3. The power module as claimed in claim 1, in which the at least one additional thermal capacitance is made of molybdenum.

4. The power module as claimed in claim 2, in which the at least one additional thermal capacitance is made of molybdenum.

5. The power module as claimed in claim 1, in which the at least one additional thermal capacitance is a DCB ceramic.

6. The power module as claimed in claim 2, in which the at least one additional thermal capacitance is a DCB ceramic.

7. The power module as claimed in claim 1, in which the at least one additional thermal capacitance is formed from a composite material AlSiC.

8. The power module as claimed in claim 2, in which the at least one additional thermal capacitance is formed from a composite material AlSiC.

9. The power module as claimed in claim 5, in which a molybdenum layer is respectively arranged between the DCB ceramic thermal capacitance and the power device.

10. The power module as claimed in claim 6, in which a molybdenum layer is respectively arranged between the DCB ceramic thermal capacitance and the power device.

11. The power module as claimed in claim 1, wherein the power device is respectively contacted on the upper side by the additional thermal capacitance.

12. The power module as claimed in claim 2, wherein the power device is respectively contacted on the upper side by the additional thermal capacitance.

13. The power module as claimed in claim 11, in which the contacting of the power device takes place on the upper side by bonding wire contacting.

14. The power module as claimed in claim 11, in which the contacting of the power device takes place via copper lugs, which copper lugs are connected to the additional thermal capacitance by a sintered layer.

15. The power module as claimed in claim 11, in which the contacting of the power device takes place via a lower copper layer of the additional thermal capacitance, which is formed as a DCB ceramic.

16. The power module as claimed in claim 1, wherein the heat sink is a copper heat sink.

17. The power module as claimed in claim 2, wherein the heat sink is a copper heat sink.

18. The power module as claimed in claim 1, wherein the heat sink additionally has cooling channels, in which a cooling medium for absorbing dissipated heat of the power device flows.

19. The power module as claimed in claim 2, wherein the heat sink additionally has cooling channels, in which a cooling medium for absorbing dissipated heat of the power device flows.

20. The power module as claimed in claim 1, wherein the at least one power device is an SiC power device.

* * * * *